(12) United States Patent
Das Purkayastha

(10) Patent No.: US 11,462,278 B2
(45) Date of Patent: Oct. 4, 2022

(54) METHOD AND APPARATUS FOR MANAGING SEED VALUE FOR DATA SCRAMBLING IN NAND MEMORY

(71) Applicant: Samsung Electronics Co., Ltd., Suwon-si (KR)

(72) Inventor: Saugata Das Purkayastha, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/000,776

(22) Filed: Aug. 24, 2020

(65) Prior Publication Data
US 2021/0375374 A1  Dec. 2, 2021

(30) Foreign Application Priority Data

May 26, 2020 (IN) .............................. 202041022041

(51) Int. Cl.
  *G11C 16/34* (2006.01)
  *G11C 16/08* (2006.01)
  (Continued)

(52) U.S. Cl.
  CPC ........ *G11C 16/3404* (2013.01); *G11C 7/1006* (2013.01); *G11C 7/1072* (2013.01);
  (Continued)

(58) Field of Classification Search
  CPC . G11C 16/3404; G11C 16/08; G11C 16/0433; G11C 7/1072; G11C 16/26; G11C 16/20; G11C 16/30; G11C 2211/5643; G11C 7/1006; G11C 16/10; G11C 16/0483; G11C 16/3427; G06F 12/0802; G06F 2212/7203; G06F 12/0246; G06F 3/0614; G06F 3/064; G06F 3/0656; G06F 3/0658; G06F 3/0679; G06F 12/1009
  See application file for complete search history.

(56) References Cited

U.S. PATENT DOCUMENTS

| 10,943,662 B1* | 3/2021 | Linnen ................ G11C 11/5635 |
| 2009/0067244 A1* | 3/2009 | Li ........................ G11C 11/5628 365/185.12 |

(Continued)

FOREIGN PATENT DOCUMENTS

EP  2396791 B1  8/2014

*Primary Examiner* — Jay W. Radke
(74) *Attorney, Agent, or Firm* — Harness, Dickey & Pierce, P.L.C.

(57) ABSTRACT

Embodiments herein disclose a method for managing seed value for data scrambling in a NAND memory. The method includes detecting, by a NAND controller, a first scrambling of the data of a word line in the NAND memory. The method further includes caching, by the NAND controller, at least one of a last written data of the word line post the first scrambling for each open block in a Dynamic Random Access Memory (DRAM) for programming the word line, and a super page of the last written data of the word line in the DRAM for programming the super page. The method can be used to manage the seed value which is used for NAND page scrambling, which can reduce retention effect. As a result, the retention recycles for the NAND cells may be reduced, which may improve endurance.

18 Claims, 9 Drawing Sheets

(51) Int. Cl.
*G11C 16/20* (2006.01)
*G11C 7/10* (2006.01)
*G11C 16/30* (2006.01)
*G11C 16/04* (2006.01)
*G11C 16/26* (2006.01)
*G11C 16/10* (2006.01)

(52) U.S. Cl.
CPC .......... *G11C 16/0433* (2013.01); *G11C 16/08* (2013.01); *G11C 16/10* (2013.01); *G11C 16/20* (2013.01); *G11C 16/26* (2013.01); *G11C 16/30* (2013.01); *G11C 16/3427* (2013.01); *G06F 2212/7203* (2013.01); *G11C 16/0483* (2013.01)

(56) References Cited

U.S. PATENT DOCUMENTS

2016/0283113 A1* 9/2016 Sudo .................. G11C 16/3427
2017/0200501 A1* 7/2017 Yang .................. G11C 16/0483

* cited by examiner

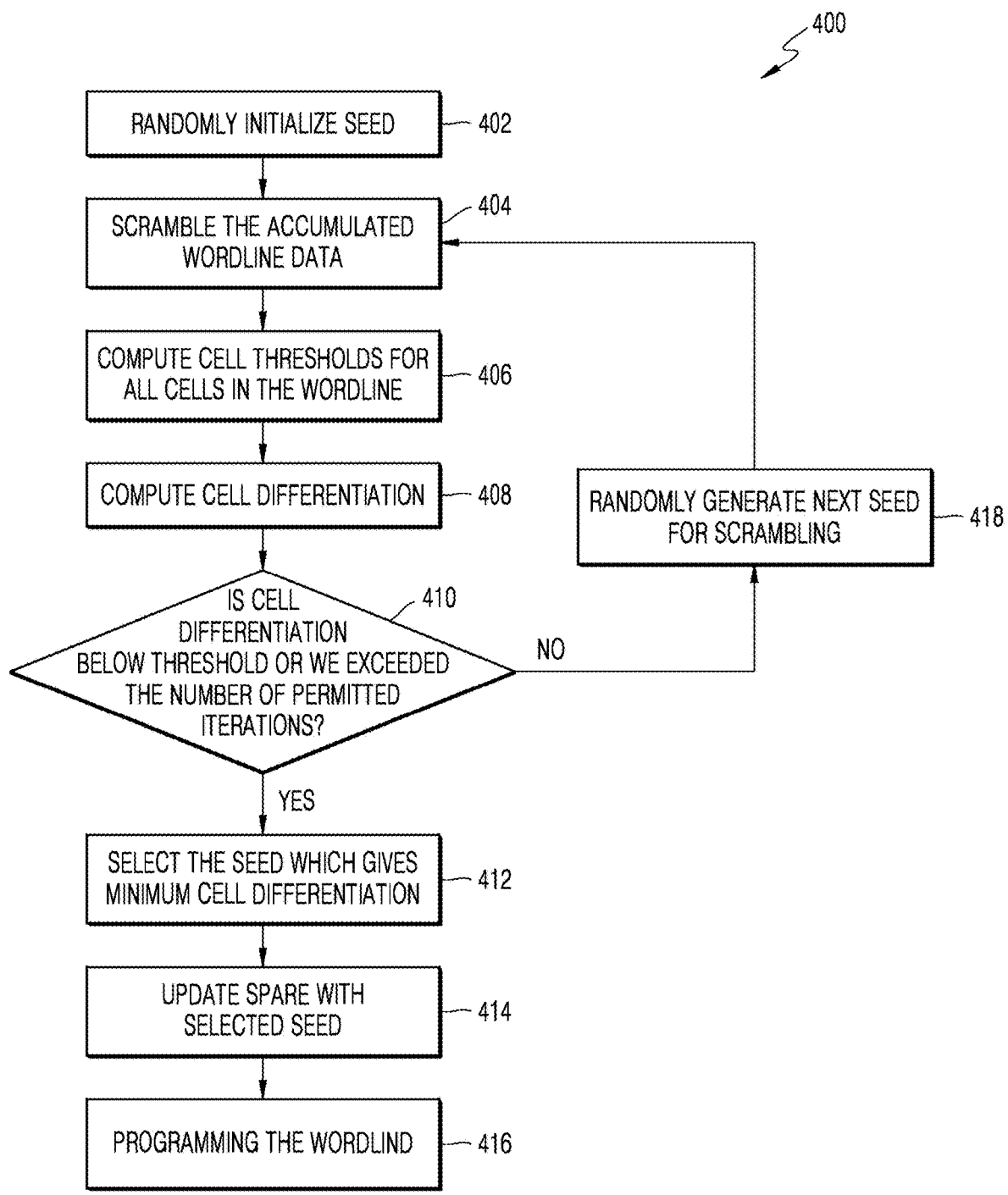

METHOD AND APPARATUS FOR MANAGING SEED VALUE FOR DATA SCRAMBLING IN NAND MEMORY

CROSS-REFERENCE TO RELATED APPLICATION

This application claims priority under 35 U.S.C. § 119 to Indian Patent Application No. 202041022041 filed on May 26, 2020, in the Indian Intellectual Property Office, the disclosure of which is incorporated by reference herein in its entirety.

The present disclosure relates to a memory system, and is more specifically related to a method and apparatus for managing seed value for data scrambling in a NAND memory to improve data retention.

BACKGROUND

Data retention is an important phenomenon in a NAND memory which causes a change in threshold voltage in NAND cells. In existing methods, a Flash Translation Layer (FTL) performs a periodic patrol read to identify the NAND cells which are on the verge of unrecoverable error due to retention and recycles them. The FTL accumulates data for a full word line before programming. In general, three dimensional (3D) NAND has a unique charge loss mechanism of lateral charge migration due to stronger electric field between neighboring cells of different word lines. The stronger electric field is created when neighbor cells of the different word lines are storing extreme NAND cell thresholds. The data retention rate may increases, if the electric field is high.

FIG. 1 is an example illustration in which page data to the NAND cell distribution is depicted, according to conventional art. In order to achieve equal distribution of number of cells in different NAND states within the word line, the NAND page data is scrambled using a randomizer seed for scrambling. The FTL stores the seed in a spare area of the NAND page and after reading the page from the NAND, the seed from the spare area is used to descramble the NAND page. In a Triple-level Cell (TLC) NAND, there are eight states and a word line is composed of three pages. The three pages in the TLC NAND are lower, middle and upper pages. Bit by bit, data from each page is combined and encoded to a specific state. Encoding of data in the TLC NAND is NAND specific and relates to how the sense will be done.

Many conventional methods have been proposed for recycling NAND cells which are on the verge of unrecoverable error to improve data retention. This is achieved by scrambling the data in the NAND page using a randomizer seed. The randomizer seed scrambles the data in the NAND page in order to achieve equal distribution of number of cells in different NAND states within the word line so as to reduce data retention effect. But a drawback with the conventional methods and apparatuses employing a randomizer seed for data scrambling in order to achieve improved retention effect is that the randomizer seed used for scrambling the data in the NAND page might not be suitable in certain conditions due to differences in voltages of neighboring cells in the word line.

Thus, it may be advantageous to address the above mentioned disadvantages or other shortcomings by providing a method and apparatus which manages seed value for data scrambling in the NAND memory to improve data retention and/or provide a useful alternative.

SUMMARY

Embodiments provide a method and NAND memory for managing seed value for data scrambling to improve data retention.

Embodiments manage the seed value which is used for NAND page scrambling, which can reduce retention effect.

Accordingly, embodiments herein disclose a method for managing seed value for data scrambling in a NAND memory. The method includes detecting, by a NAND controller, a first scrambling of data of a word line in the NAND memory, and caching, by the NAND controller, at least one of a last written data of the word line post the first scrambling for each open block in a Dynamic Random Access Memory (DRAM) for programming the word line, and a super page of the last written data of the word line in the DRAM for programming the super page.

Embodiments herein disclose an apparatus for managing seed value for data scrambling. The apparatus includes a NAND memory cell array, a Dynamic Random Access Memory (DRAM), and a NAND controller configured to cause the apparatus to detect a first scrambling of data of a word line in the NAND memory cell array, and cache at least one of a last written data of the word line post the first scrambling for each open block in a DRAM of the NAND memory for programming the word line and a super page of the last written data of the word line in the DRAM for programming the super page.

These and other aspects of the embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

The inventive concepts are illustrated in the accompanying drawings, throughout which like reference letters indicate corresponding parts in the various figures. The embodiments herein will be better understood from the following description with reference to the drawings, in which:

FIG. 4 is an example flow chart illustrating various operations for programming the word line, according to embodiments as disclosed herein.

DETAILED DESCRIPTION

Figure 1:
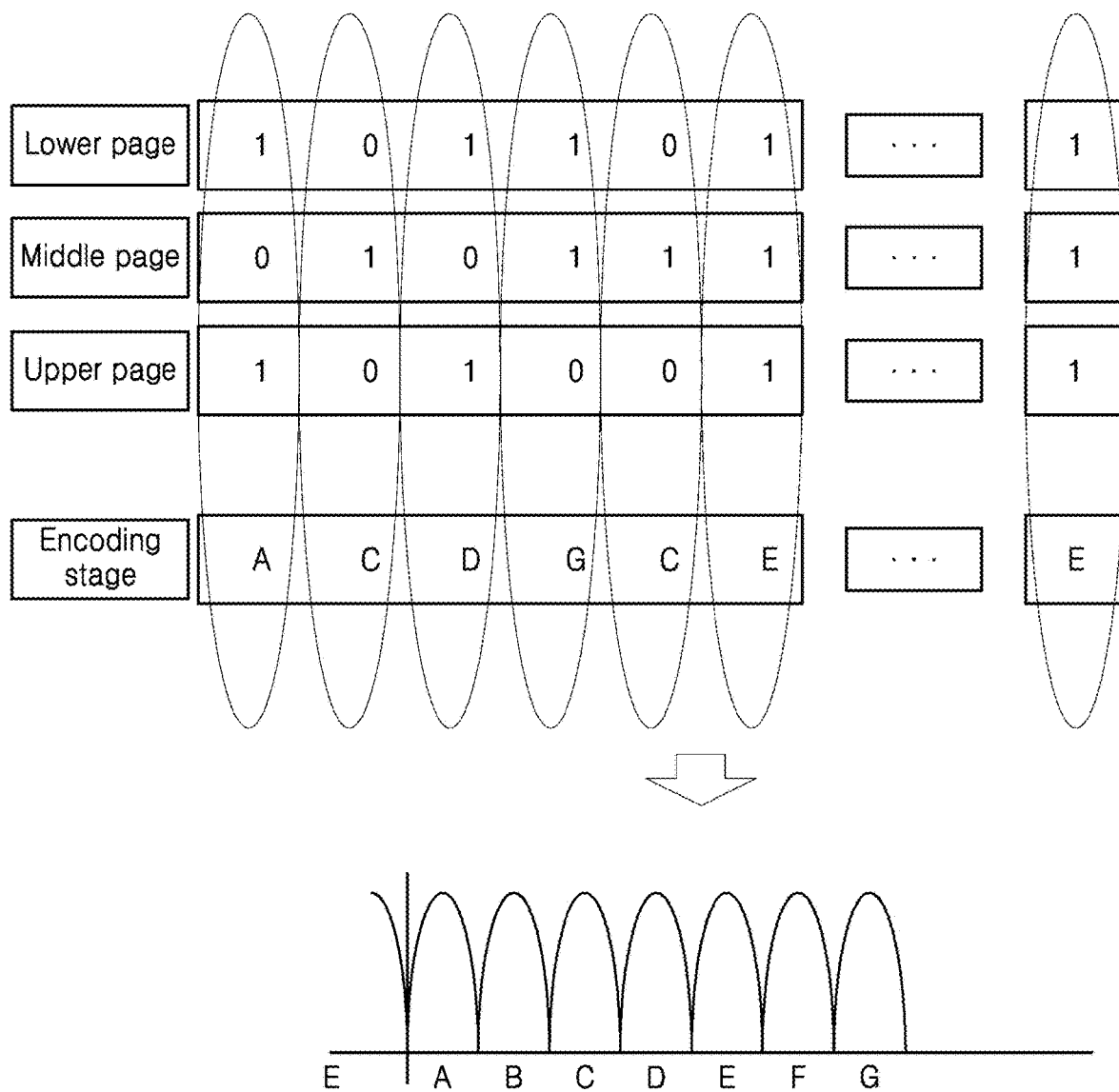
FIG. 1 is an example illustration in which page data to the NAND cell distribution is depicted, according to conventional art.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. As used herein, the term "and/or" includes any and all combinations of one or more of the associated listed items. Expressions such as "at least one of," when preceding a list of elements, modify the entire list of elements and do not modify the individual elements of the list. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by electronic devices such as mobile, laptop, mini-tablets, or the like, and may optionally be driven by firmware and software. The modules may, for example, be embodied in one or more electronic devices, or on any other communication devices and the like. The modules constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the invention. Likewise, the blocks of the embodiments may be physically combined into more complex blocks without departing from the scope of the invention.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Like numbers refer to like elements throughout. Thus, the same or similar numbers may be described with reference to other drawings even if they are neither mentioned nor described in the corresponding drawing. Also, elements that are not denoted by reference numbers may be described with reference to other drawings. Although the terms first, second, etc. may be used herein to describe various elements, these elements should not be limited by these terms. These terms are generally only used to distinguish one element from another.

Accordingly, embodiments herein disclose a method for managing seed value for data scrambling in a NAND memory. The method includes detecting first scrambling of data of a word line in the NAND memory by a NAND controller (110a). The NAND controller (110a) may include processing circuitry such as hardware including logic circuits; a hardware/software combination such as a processor executing software; or a combination thereof. For example, the processing circuitry more specifically may include, but is not limited to, a central processing unit (CPU), and arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The method further includes at least one of caching, by the NAND controller a last written data of the word line post the first scrambling for each open block in a DRAM (104) of a memory device for programming the word line, and caching, in the DRAM (104) a super page comprising the last written data of the word line for programming the super page.

Unlike conventional methods and systems, the method can be used to manage the seed value which is used for NAND page scrambling, which can reduce retention effect. As a result, the retention recycles for the NAND cells may be reduced, which may improve endurance.

The proposed method utilizes best seed selection during the word line programming to perform scrambling of data of the word line. The seed may be stored in a spare area of the word line. The spare area of the word line is updated with selected best seed and the programming of the word line is finished. For selecting the best seed to perform data scrambling, a number of iterations are performed. The number of iterations for selecting the best seed value to perform the data scrambling is dependent on the system performance desired. The proposed method can be used when writing both host data, as well as recycle data. The method may be implemented for a high endurance Solid-state Drives (SSDs). The method may be used to reduce the number of bit-flips due to retention.

Referring now to the drawings and more particularly to FIGS. 2A through 5, there are shown embodiments of the inventive concepts.

Figure 2A:
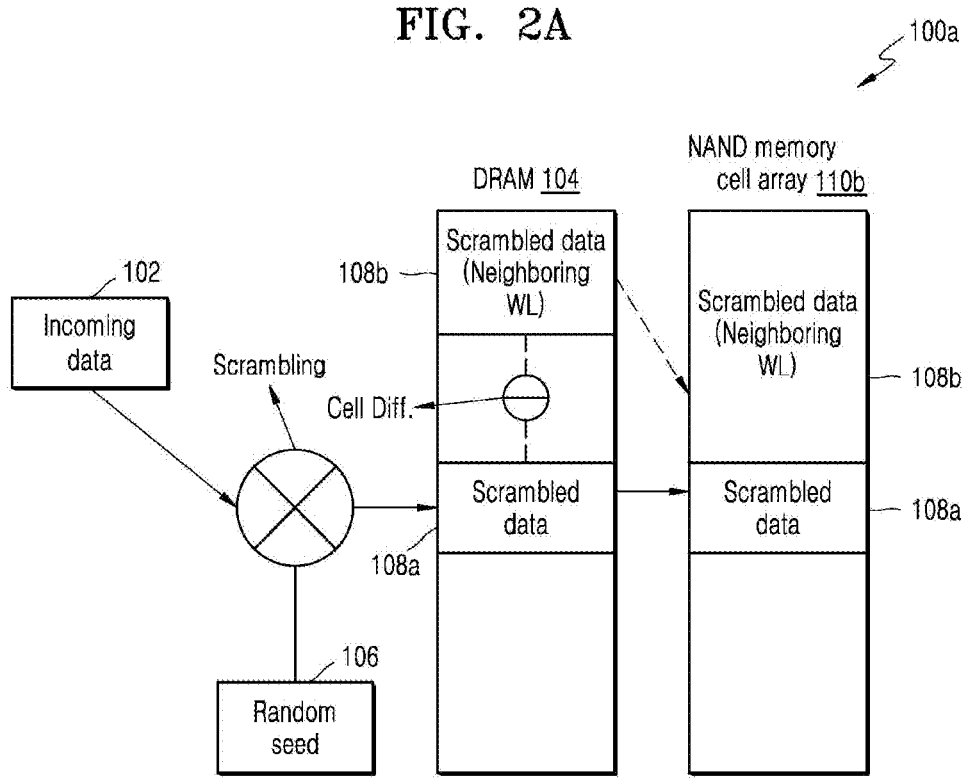
FIG. 2A is an example illustration in which an apparatus manages seed value for data scrambling in a NAND memory, according to embodiments as disclosed herein.

FIG. 2A is an example illustration in which an apparatus (100a) manages seed value for data scrambling in a NAND memory (110) in a memory device, according to the embodiments as disclosed herein. The memory device may be, for example, but not limited to a solid-state drive (SSD) device, an embedded Multi Media Card (eMMC), a secure digital (SD) card or the like. The apparatus (100a) includes an incoming data (102) of a word line in a DRAM (104) to be programmed. The DRAM (104) includes a plurality of open FTL blocks to accumulate the incoming data (102) of the word line, and perform write operation on the incoming data (102) of the word line. A NAND controller (110a) is configured to scramble the incoming data (102) using the random seed (106) and cache last written data of the word line post the first scrambling of the incoming data (102) for each open FTL block in the DRAM (104) of the memory device for programming the word line, and a super page of the last written data of the word line in the DRAM (104) for programming the super page. A cell differentiation is computed, where the cell differentiation is average of threshold voltage differences between all neighboring cells of the last programmed word line and a new word line. The cell differentiation is computed between scrambled data (108b) of a neighboring word line and scrambled data (108a) of the new word line. The scrambled data (108b) of the neighboring word line and the scrambled data (108a) of the new word line are stored in at least one page of a NAND memory (110).

Figure 2B:
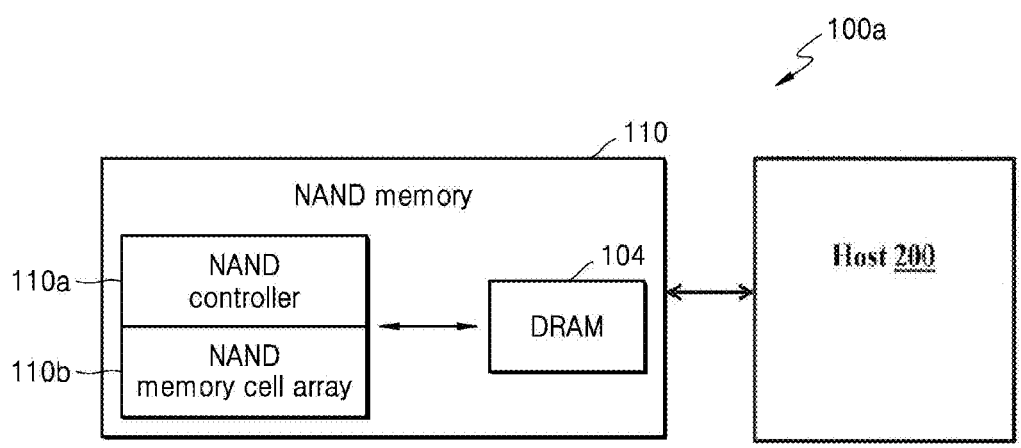
FIG. 2B illustrates various hardware components of the apparatus for managing seed value for data scrambling in the NAND memory, according to embodiments as disclosed herein.
Figure 2C:
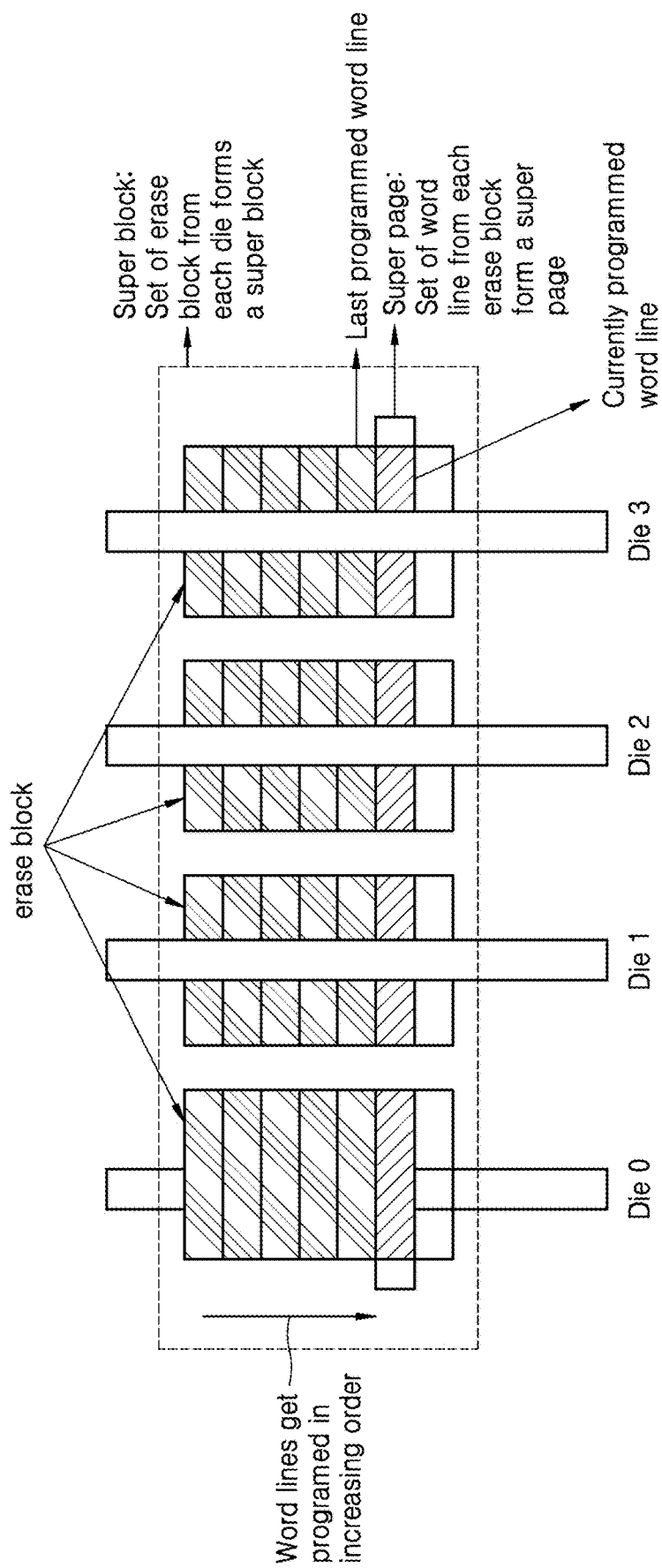
FIG. 2C is a schematic representation of a NAND memory cell, according to embodiments as disclosed herein.

FIG. 2C is a schematic representation of a NAND memory cell, according to the embodiments as disclosed herein. As shown in FIG. 2C, a super block may be formed by a set of erase blocks from each die. A super page may be formed by a set of word lines from each erase block. The last programmed word line, the new word line, the super block and the super page are illustrated in the FIG. 2C.

As shown, in FIG. 2A, the NAND controller (110a) is configured to select the seed for programming the data of the word line based on the last written data of the word line cached in the DRAM (104). Further, the NAND controller (110a) initiates programming of the word line using the selected seed.

FIG. 2B illustrates various hardware components of the apparatus (100a) for managing seed value for data scrambling in the NAND memory (110), according to the embodiments as disclosed herein. In an embodiment, the apparatus (100a) includes a host (200) and the NAND memory (110). The host (200) sends the incoming data (102) of the word line which may be scrambled in order to improve retention caused due to large threshold differences between cells of the neighboring word line and the cells of the new word line. The host (200) may include a memory (not shown), a processor (not shown) and a communicator (not shown). In the embodiment, the NAND memory (110) includes a NAND controller (110a) and a NAND memory cell array (110b). The NAND controller (110a) is coupled with the NAND memory array (110b). The DRAM (104) is connected with the NAND controller (110a).

In an embodiment, the NAND controller (110a) is configured to receive the incoming data (102) of the word line from the host (200). The NAND controller (110a) is configured to cache the incoming data (102) of the new word line in the DRAM (104). Further, the NAND controller (110a) is configured to randomly initiate a seed for a second scrambling of the incoming data (102) of the word line from the host (200) with the last written word line cached in the DRAM (104). Further, the NAND controller (110a) is configured to perform the second scrambling of the incoming data (102) of the word line from the host (200) with the new word line. Further, the NAND controller (110a) is configured to determine a cell threshold for each of the open FTL blocks in the last written word line cached in the DRAM (104).

Further, the NAND controller (110a) is configured to determine the cell differentiation voltage between a neighboring NAND cell associated with the last written data of the word line post the first scrambling and the neighboring NAND cell associated with the incoming data (102) post the second scrambling. Further, the NAND controller (110a) is configured to determine whether the cell differentiation meets the allowed threshold cell differentiation voltage. Further, the NAND controller (110a) is configured to perform selection of a randomly initialized seed for the programming of the word line, and updating the spare area of the word line with the selected seed in response to determining that the cell threshold meets the cell differentiation voltage, and randomly generate another seed in response to determining that the cell threshold does not meets the cell differentiation voltage.

In an embodiment, the NAND controller (110a) is further configured to determine whether a number of iterations to select the seed is met. Further, the NAND controller (110a) is configured to perform random generation of another seed in response to determining that the number of iteration to select the seed is not met. Further, the NAND controller (110a) is configured to perform selection of the seed to update the spare area of the word line and initiate programming of the word line in response to determining that number of iteration to select the seed is met.

FIG. 2A and FIG. 2B show various hardware components of the apparatus (100a), but it is to be understood that other embodiments are not limited thereon. In other embodiments, the apparatus (100a) may include fewer or more number of components. Further, the labels or names of the components are used only for illustrative purpose and do not limit the scope of the present disclosure. One or more components can be combined together to perform same or substantially similar function to manage the seed value for scrambling the data in the NAND memory to program the word line in the NAND memory (110).

Figure 3A:
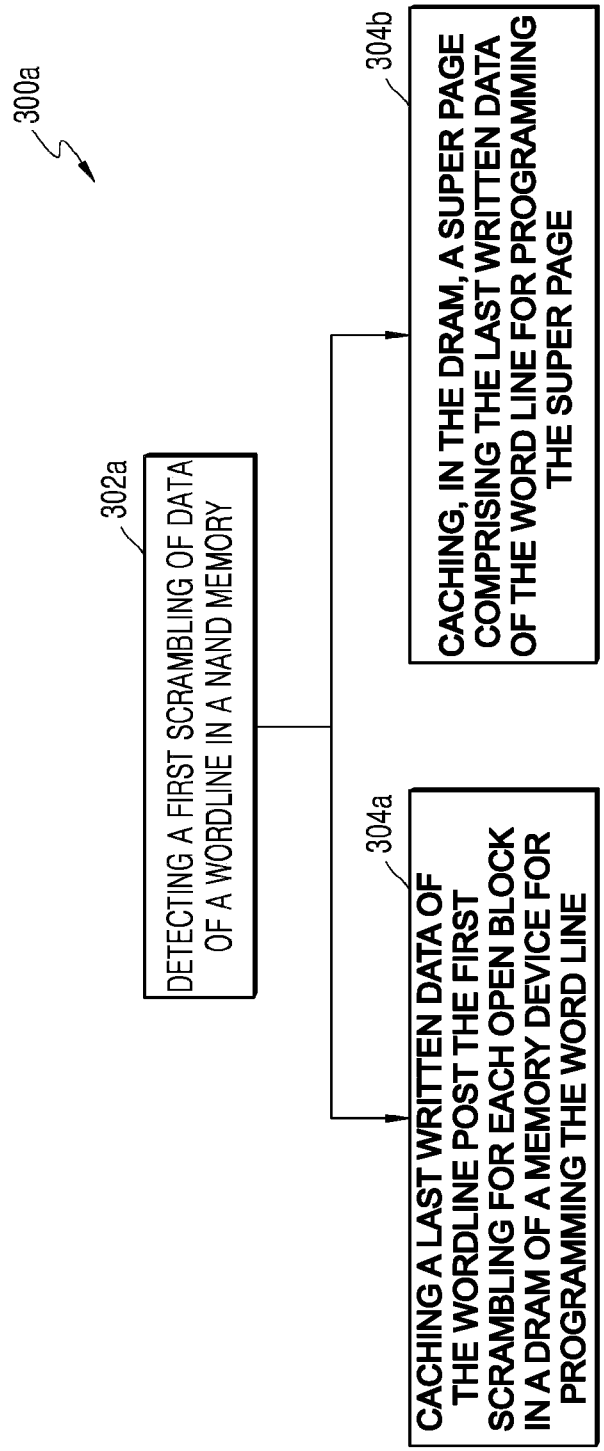
FIG. 3A is a flow diagram illustrating a method for managing the seed value for data scrambling in the NAND memory, according to embodiments as disclosed herein.

FIG. 3A is a flow diagram (300a) illustrating a method for managing the seed value for data scrambling in the NAND memory (110), according to the embodiments as disclosed herein. The operations (302-304b) are performed by the NAND controller (110a). At (302), the method includes detecting the first scrambling of data of the word line in the NAND memory (110). At (304a), the method includes caching at least one of the last written data of the word line post the first scrambling for each open FTL block in the DRAM (104) of the memory device for programming the word line. At (304b), the method includes caching the super page of the last written data of the word line in the DRAM (104) for programming the super page.

Figure 3B:
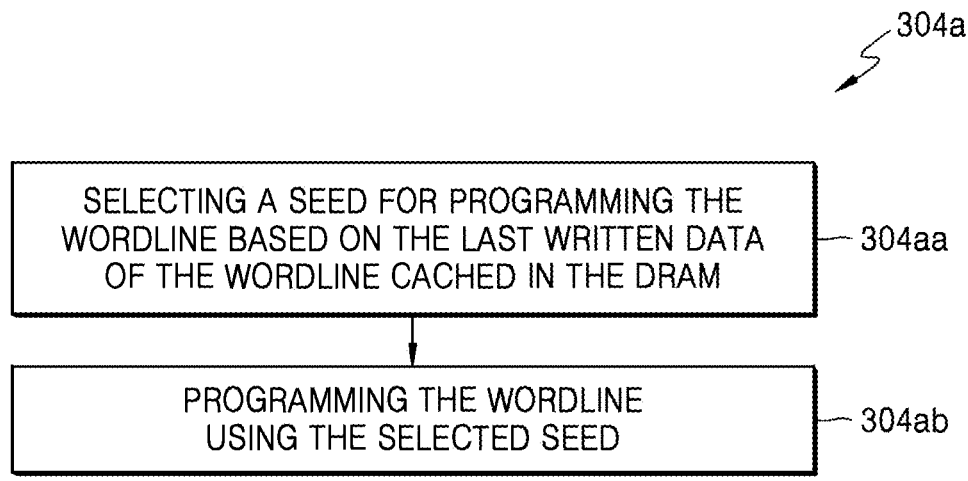
FIG. 3B is a flow diagram illustrating various operations for programming the word line, according to embodiments as disclosed herein.

FIG. 3B is a flow diagram (304a) illustrating various operations for programming the word line, according to the embodiments as disclosed herein. The operations (304aa and 304ab) are performed by the NAND controller (110a). At (304aa), the method includes selecting the seed for programming the word line based on the last written data of the word line cached in the DRAM (104). At (304ab), the method includes programming the word line using the selected seed.

Figure 3C:
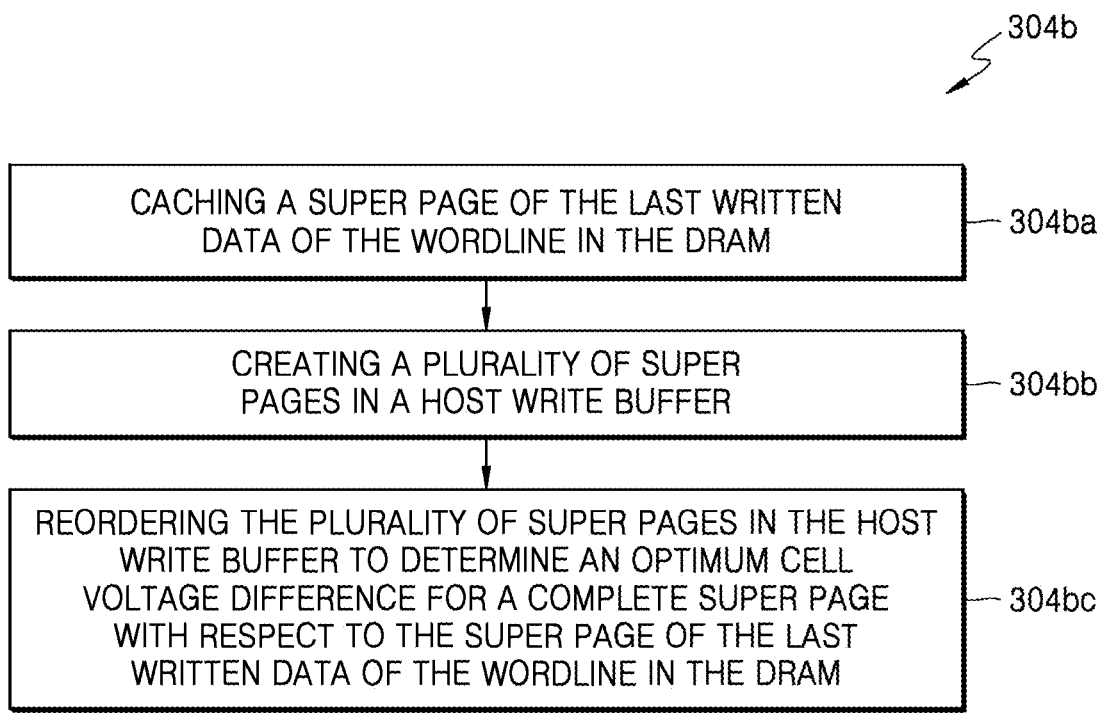
FIG. 3C is a flow chart illustrating various operations for programming the super page, according to embodiments as disclosed herein.

FIG. 3C is a flow chart (304b) illustrating various operations for programming the super page, according to the embodiments as disclosed herein. The operations (304ba-304bc) are performed by a flash translation layer (FTL) module. An FTL module is executed in the memory device for mapping the user pages to physical NAND pages. The FTL module may implemented by the NAND controller (110a). At (304ba), the method includes caching the super page of the last written data of the word line in the DRAM (104). At (304bb), the method includes creating the plurality of super pages in a host write buffer. At (304bc), the method includes reordering the plurality of super pages in the host write buffer to determine an optimum or desired cell voltage difference for a complete super page with respect to the super page of the last written data of the word line in the DRAM (104).

Figure 3D:
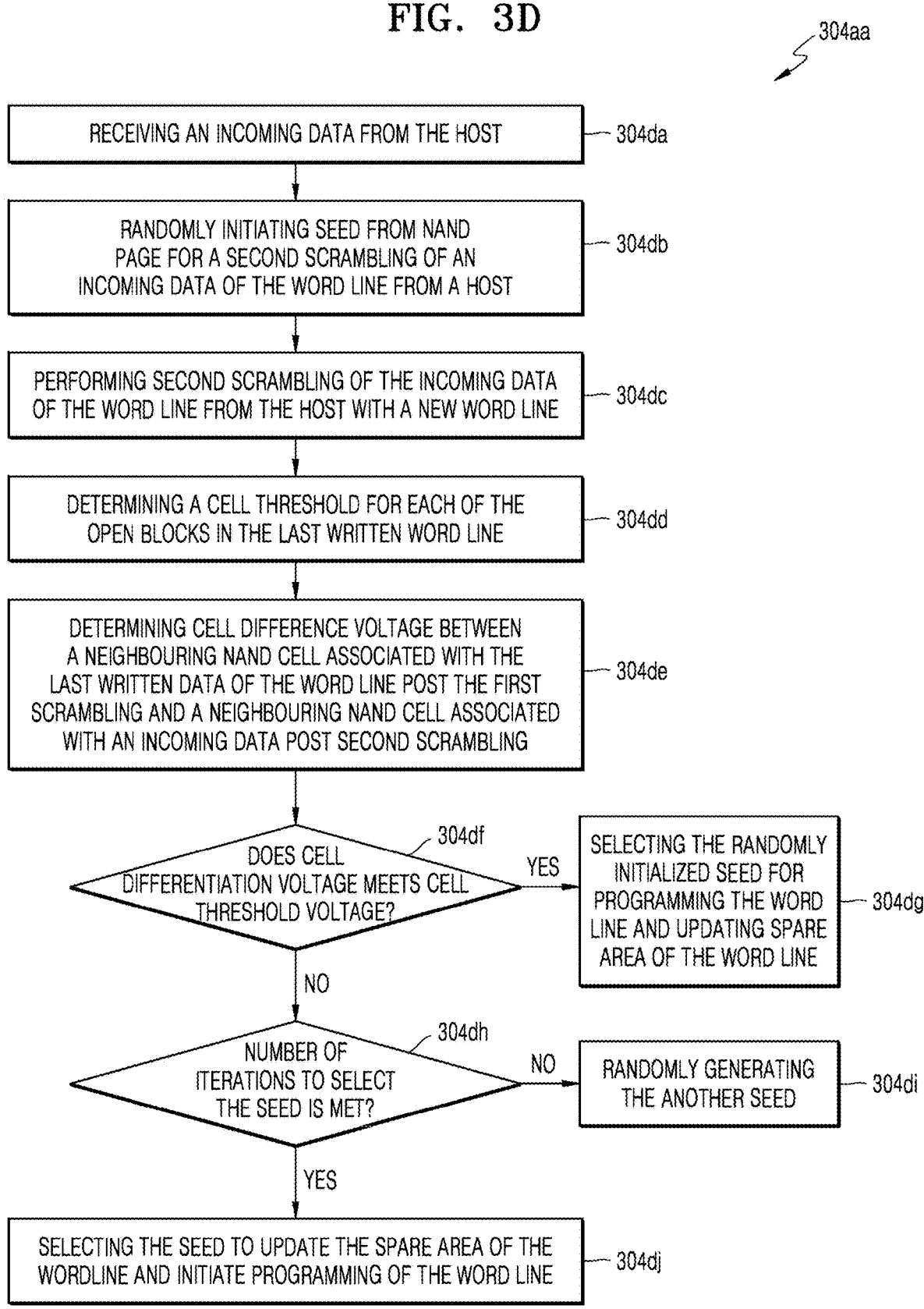
FIG. 3D is a flow chart illustrating various operations for selecting the seed for programming the word line based on the last written data of the word line cached in the DRAM, according to embodiments as disclosed herein.

FIG. 3D is a flow chart (304*aa*) illustrating various operations for selecting the seed for programming the word line based on the last written data of the word line cached in the DRAM (104), according to the embodiments as disclosed herein. The operations (304*da*-304*dj*) are performed by the NAND controller (110*a*). At (304*da*), the method includes receiving the incoming data (102) of the word line from the host (200). At (304*db*), the method includes randomly initiating the seed from the NAND page for second scrambling of the incoming data (102) of the word line from the host (200) with the last written word line cached in the DRAM (104). At (304*dc*), the method includes performing the second scrambling of the incoming data (102) of the word line from the host (200) with the new word line. At (304*dd*), the method includes determining cell threshold for each of the open FTL blocks in the last written word line. At (304*de*), the method includes determining the cell differentiation voltage between the neighboring NAND cell associated with the last written data of the word line post the first scrambling and the neighboring NAND cell associated with the incoming data (102) post the second scrambling. At (304*df*), the method includes determining whether the cell threshold meets the cell differentiation voltage. If the cell threshold meets the cell differentiation voltage then, at (304*dg*), the method includes performing selection of randomly initialized seed for the programming of the word line, and updating the spare area of the word line with the selected seed. If the cell threshold does not meet the cell differentiation voltage, at (304*dh*), the method includes determining whether the number of iterations to select the seed to be met. If the number of iterations to select the seed is not met then, at 304*di*, the method includes performing the random generation of another seed. If that number of iteration to select the seed is met at 304*dj,* the method includes selecting the seed to update the spare area of the word line and initiate programming of the word line.

Figure 3E:
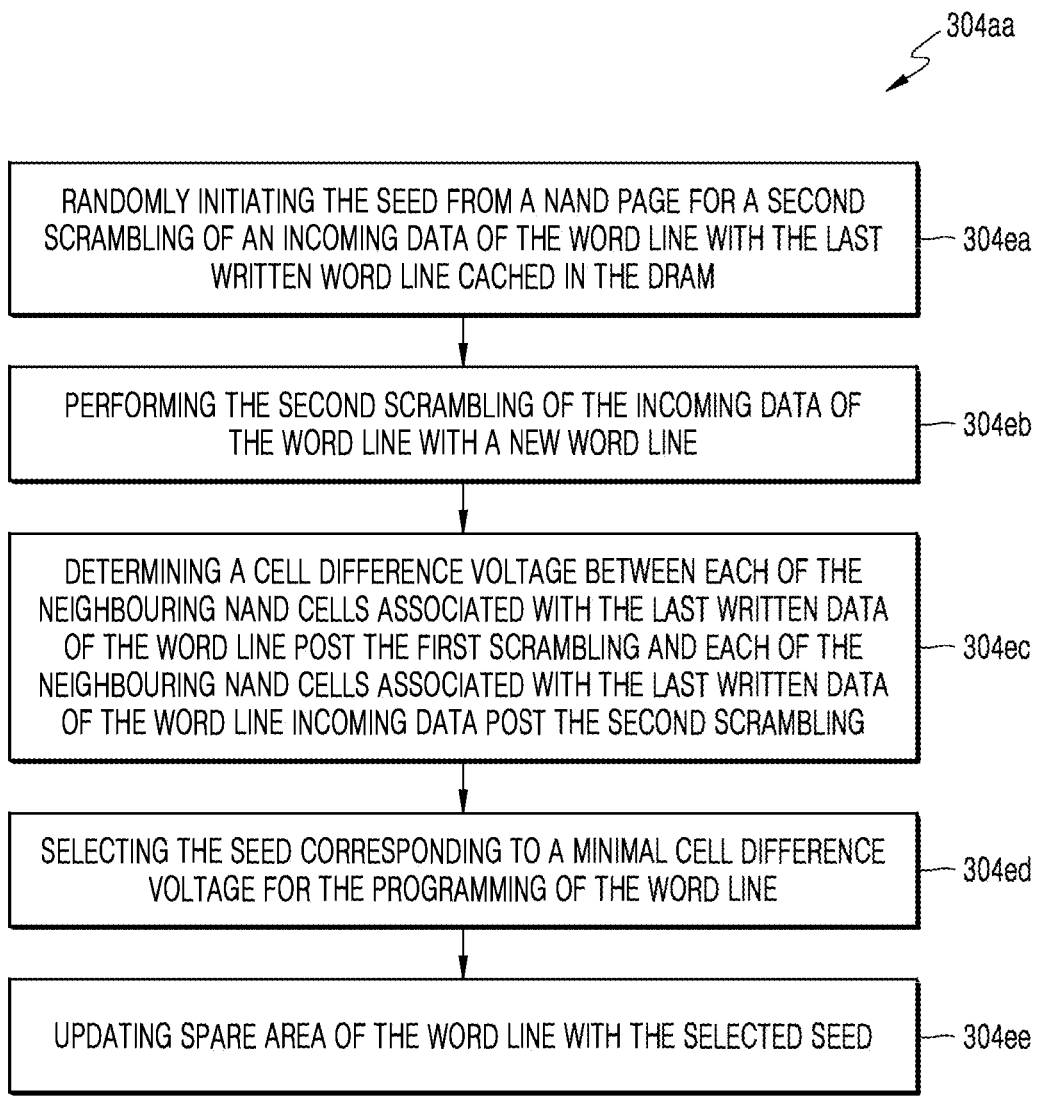
FIG. 3E is another flow chart illustrating various operations for selecting the seed for programming the word line based on the last written data of the word line cached in the DRAM, according to embodiments as disclosed herein.

FIG. 3E is another flow chart (304*aa*) illustrating various operations for selecting the seed for programming the word line based on the last written data of the word line cached in the DRAM (104), according to the embodiments as disclosed herein. The operations (304*ea*-304*ef*) are performed by the NAND controller (110*a*).

At 304*ea,* the method includes randomly initiating the seed from the NAND page for the second scrambling of the incoming data of the word line with the last written word line cached in the DRAM (104). At 304*eb,* the method includes performing the second scrambling of the incoming data of the word line with a new word line. At 304*ec,* the method includes determining the cell difference voltage between each of the neighbouring NAND cells associated with the last written data of the word line post the first scrambling and each of the neighbouring NAND cells associated with the last written data of the word line incoming data post the second scrambling. At 304*ed,* the method includes selecting the seed corresponding to the minimal cell difference voltage for the programming of the word line. At 304*ee,* the method includes updating the spare area of the word line with the selected seed.

FIG. 4 is an example flow chart (400) illustrating various operations for programming the word line, according to the embodiments as disclosed herein. The operations (402-418) are performed by the NAND controller (110*a*). At (402), the method includes randomly initiating the seed from the NAND page for the second scrambling of the incoming data (102) of the word line with the last written word line cached in the DRAM (104). At (404), the method includes the second scrambling of the incoming data (102) of the word line with the new word line. At (406), the method includes determining cell thresholds for all the neighboring NAND cells in the word line. At (408), the method includes determining the cell differentiation voltage between each of the neighboring NAND cells associated with the last written data of the word line post the first scrambling and each of the neighboring NAND cells associated with the incoming data (102) post the second scrambling by the NAND controller (110*a*).

At (410), the method includes determining whether cell differentiation is below cell threshold or the numbers of permitted iterations are exceeded. If the cell differentiation is below the cell threshold or the numbers of permitted iterations are exceeded then, at (412), the method includes selecting the seed corresponding to a minimal cell difference voltage for the programming of the word line by the NAND controller (110*a*). At (414), the method includes updating the spare area of the word line with the selected seed. At (416), the method includes performing programming of the word line. If the cell threshold does not meet the cell differentiation or the numbers of permitted iterations are not exceeded then, at (418), the method includes performing random generation of next seed for scrambling the data of the word line.

Figure 5:
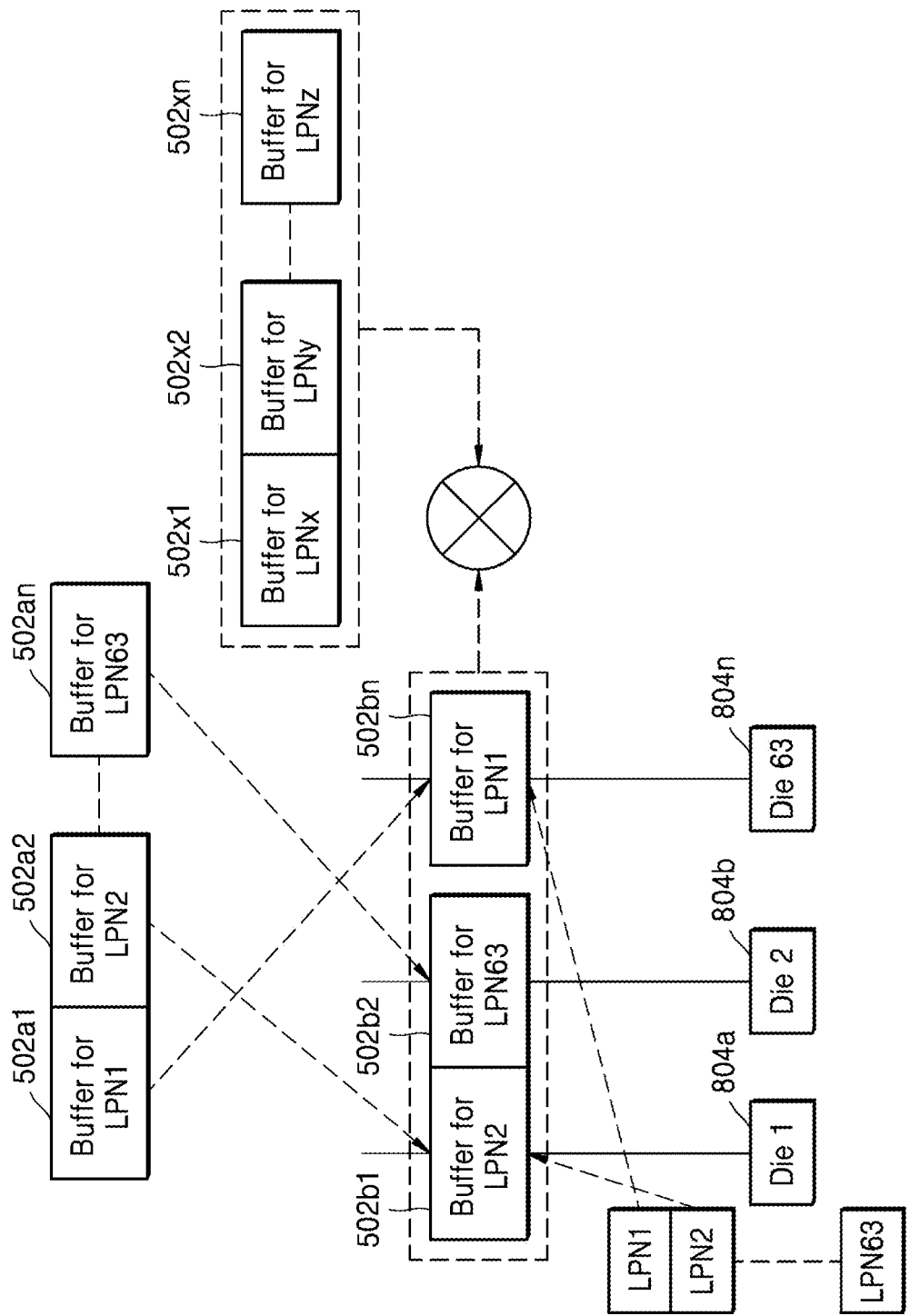
FIG. 5 is an example illustration in which the apparatus selects a die for writing the data on the host, according to embodiments as disclosed herein.

FIG. 5 is an example illustration in which the apparatus (100) selects a die for writing the data received from the host (200), according to the embodiments as disclosed herein. As shown in FIG. 5, the FTL module receives the incoming host data during a host write operation to form the complete super page in the host write buffer of a plurality of host write buffers (502*al*-502*xn*). Further, the FTL module compares the incoming host data with the last written data of the word line of a plurality of dies (502*al*-502*xn*) in the last written super page. Further, the FTL module selects at least one die from the plurality of dies (502*al*-502*xn*) for locating the super page of the plurality of super pages from the host write buffer within a stripe of the super block meeting the minimum cell differentiation and writes the host data in the selected die.

In an embodiment, FTL will keep one open block as super page or a super block for writing host data. In an embodiment, the super page or the super block includes the plurality of host write buffers (502*al*-502*xn*) as blocks from the plurality of dies (502*al*-502*xn*). In an example, say 64 blocks from 64 dies constitute the super block. The FTL remembers the super page of last written word line. Once the super page is formed in the host write buffer, the pages within the host write buffer are reordered to meet optimum or desired cell differentiation for the complete super page with respect to the last written super page.

The various actions, acts, blocks, steps, or the like in the flow diagrams (300*a,* 304*a,* 304*b,* 304*aa,* and 400) may be performed in the order presented, in a different order or simultaneously. Further, in some embodiments, some of the actions, acts, blocks, steps, or the like may be omitted, added, modified, skipped, or the like without departing from the scope of the invention.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the inventive concepts, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

I claim:

1. A method for managing seed values for data scrambling in a NAND memory, the method comprising:
   detecting, by a NAND controller, scrambled data for a word line in the NAND memory, the scrambled data being a result of a first scrambling of incoming data; and
   caching, in a dynamic random access memory (DRAM) by the NAND controller after the first scrambling, at least one of
   last written data of a previous word line in the NAND memory for each open block in the DRAM for programming the word line, or
   a previous super page of last written data for programming a super page.

2. The method of claim 1, wherein the programming the word line comprises:
   selecting, by the NAND controller, a selected seed value based on the last written data of the previous word line cached in the DRAM; and
   programming, by the NAND controller, the word line using the selected seed value.

3. The method of claim 2, wherein the selecting, by the NAND controller, the selected seed value comprises:
   randomly generating, by the NAND controller, a first seed value from a NAND page;
   performing, by the NAND controller, a second scrambling of the Incoming data using the first seed value;
   determining, by the NAND controller, a cell threshold for each of the open blocks;
   determining, by the NAND controller, a cell difference voltage between a neighboring NAND cell associated with the last written data of the previous word line and a neighboring NAND cell associated with the scrambled data post the second scrambling;
   determining, by the NAND controller, whether the cell difference voltage meets the cell threshold;
   randomly generating, by the NAND controller, a second seed value in response to determining that the cell difference voltage does not meet the cell threshold; and
   selecting, by the NAND controller, a randomly generated seed value as the selected seed value, and updating a spare area of the word line with the selected seed value in response to determining that the cell difference voltage meets the cell threshold.

4. The method of claim 3, wherein the randomly generating the second seed value comprises:
   determining, by the NAND controller, whether a number of iterations to select a seed value is met;
   randomly generating, by the NAND controller, the second seed value in response to determining that the number of iterations to select a seed value is not met; and
   selecting, by the NAND controller, the first seed value as the selected seed value in response to determining that the number of iterations to select a seed value is met.

5. The method of claim 4, wherein the number of iterations is dependent on a performance of the NAND controller.

6. The method of claim 3, wherein the selecting, by the NAND controller, the randomly generated seed value comprises:
   determining, by the NAND controller, a cell difference voltage between each of the neighboring NAND cells associated with the last written data of the previous word line and each of the neighboring NAND cells associated with the scrambled data post the second scrambling;
   selecting, by the NAND controller, a randomly generated seed value corresponding to a minimal cell difference voltage as the selected seed value; and
   updating, by the NAND controller, the spare area of the word line with the selected seed value.

7. The method of claim 1, wherein the programming the super page comprises:
   caching, by the NAND controller, the previous super page of the last written data in the DRAM;
   creating, by the NAND controller, a plurality of super pages in a host write buffer; and
   reordering, by the NAND controller, the plurality of super pages in the host write buffer to determine a desired cell voltage difference for a complete super page with respect to the previous super page of the last written data cached in the DRAM.

8. The method of claim 7, further comprising:
   receiving, by the NAND controller, the incoming data as incoming host data during a host write operation to form the complete super page in the host write buffer of a plurality of host write buffers;
   comparing, by the NAND controller, the scrambled data with the last written data, wherein the previous super page is of a plurality of dies;
   selecting, by the NAND controller, at least one die from the plurality of dies for locating a super page of the plurality of super pages from the host write buffer within a stripe of a super block meeting a minimum cell differentiation voltage; and
   writing, by the NAND controller, the scrambled data in the selected die.

9. The method of claim 8, further comprising:
   pointing to the location of the super page after programming of the super block.

10. An apparatus for managing seed values for data scrambling in a NAND memory, the apparatus comprising:
    a NAND memory cell array;
    a Dynamic Random Access Memory (DRAM); and
    a NAND controller configured to cause the apparatus to:
       detect scrambled data for a word line in the NAND memory cell array, the scrambled data being a result of a first scrambling of incoming data; and
       cache, in the DRAM post the first scrambling, at least one of
       last written data of a previous word line in the NAND memory for each open block in the DRAM for programming the word line, or
       a previous super page of last written data for programming a super page.

11. The apparatus of claim 10, wherein the NAND controller is further configured to cause the apparatus to:
    select a selected seed value for the programming of the word line based on the last written data of the previous word line cached in the DRAM; and initiate the programming of the word line using the selected seed value.

12. The apparatus of claim 11, wherein the NAND controller is further configured to cause the apparatus to:
  randomly generate a first seed value from a NAND page;
  perform a second scrambling of the incoming data using the first seed value;
  determine a cell threshold for each of the open blocks;
  determine a cell difference voltage between a neighboring NAND cell associated with the last written data of the previous word line and a neighboring NAND cell associated with the scrambled data post the second scrambling;
  determine whether the cell difference voltage meets the cell threshold;
  randomly generate a second seed value in response to determining that the cell difference voltage does not meet the cell threshold; and
  select a randomly generated seed value as the selected seed value and update a spare area of the word line with the selected seed value in response to determining that the cell threshold meets the cell difference voltage.

13. The apparatus of claim 12, wherein the NAND controller is further configured to cause the apparatus to:
  determine whether a number of iterations to select a seed value is met;
  randomly generate the second seed value in response to determining that the number of iterations to select a seed value is met.

14. The apparatus of claim 13, wherein the number of iterations is dependent on a performance of the NAND controller.

15. The apparatus of claim 12, wherein the NAND controller is further configured to cause the apparatus to:
  determine a cell difference voltage between each of the neighboring NAND cells associated with the last written data of the previous word line and each of the neighboring NAND cells associated with the scrambled data post the second scrambling;
  select a randomly generated seed value corresponding to a minimal cell difference voltage as the selected seed value; and
  update the spare area of the word line with the selected seed value.

16. The apparatus of claim 10, wherein the NAND controller is further configured to cause the apparatus to:
  cache the super page of the last written data in the DRAM;
  create a plurality of super pages in a host write buffer; and
  reorder the plurality of super pages in the host write buffer to determine a desired cell voltage difference for a complete super page with respect to the previous super page of the last written data cached in the DRAM.

17. The apparatus of claim 16, wherein the NAND controller is further configured to cause the apparatus to:
  receive the incoming data as incoming host data during a host write operation to form the complete super page in a host write buffer of a plurality of host write buffers;
  compare the scrambled data with the last written data, wherein the previous super page is of a plurality of dies;
  select at least one die from the plurality of dies for locating a super page of the plurality of super pages from the host write buffer within a stripe of a super block meeting a minimum cell differentiation voltage; and
  write the scrambled data in the selected die.

18. The apparatus of claim 17, wherein the NAND controller is further configured to cause the apparatus to point to the location of the super page after programming of the super block.

* * * * *